United States Patent [19]

Swindler

[11] Patent Number: 5,317,483
[45] Date of Patent: May 31, 1994

[54] COMPUTER EXPANSION CARD SUPPORT STRUCTURE

[75] Inventor: Dan E. Swindler, Round Rock, Tex.

[73] Assignee: Dell U.S.A., L.P., Austin, Tex.

[21] Appl. No.: 8,923

[22] Filed: Jan. 26, 1993

[51] Int. Cl.5 ............................................. H05K 7/14
[52] U.S. Cl. .................... 361/801; 361/796; 361/752; 361/802
[58] Field of Search ............... 361/394, 390, 391, 399, 361/413, 415, 427, 737, 752, 796, 801, 802, 724, 730, 732, 747, 759; 174/52.1, 255; 439/64, 59-62; 364/708

[56] References Cited

U.S. PATENT DOCUMENTS

| | | | |
|---|---|---|---|
| 4,862,320 | 8/1989 | Schmidt et al. | 361/383 |
| 5,030,108 | 7/1991 | Babow et al. | 439/64 |
| 5,084,802 | 1/1992 | Nguyenngoc | 361/424 |
| 5,140,501 | 8/1992 | Takahashi et al. | 361/415 |
| 5,216,578 | 6/1993 | Zenitani et al. | 361/383 |

*Primary Examiner*—Leo P. Picard
*Assistant Examiner*—Young Whang
*Attorney, Agent, or Firm*—James W. Huffman; Rick Konneker

[57] ABSTRACT

A sheet metal support cage structure within a computer has an inturned side wall ledge portion and removably receives a spaced series of expansion cards. Extending along edge portions of the cards that face the ledge are sheet metal mounting brackets having outwardly bent end tab portions that overlie and engage the side wall ledge. The tabs are removably held in place on the ledge by an elongated hold-down bar secured at an inner end thereof to the cage structure for pivotal movement relative thereto between a closed position in which the bar overlies the tabs and captively retains them on the ledge, thereby locking the expansion cards in place within the cage structure, and an opened position in which the bar is moved away from the tabs and releases them from the ledge to permit the expansion cards to be removed from the cage structure. A single screw member is captively retained on the outer end of the bar and may be threaded into a corresponding opening in the ledge to releasably lock the bar in its closed position.

15 Claims, 3 Drawing Sheet

COMPUTER EXPANSION CARD SUPPORT STRUCTURE

BACKGROUND OF THE INVENTION

The present invention relates generally to computer apparatus, and more particularly relates to apparatus for operatively and removably supporting a spaced series of expansion cards within a computer.

Within the interiors of their housings modern personal computers are customarily provided with sheet metal cage structures adapted to receive and removably support a plurality of option or expansion cards which, when operatively installed in their associated cage structure, upgrade the operating capabilities of the computer. These expansion cards may be installed in the computer during its original manufacture and/or subsequently installed by the computer purchaser. Typical types of expansion cards include network, sound, graphics accelerator and multi-media cards.

An expansion card is basically a relatively small rectangular printed circuit board having, along one side edge thereof, a connector edge portion that plugs into a corresponding socket portion of the cage structure to operatively couple the installed card to the motherboard or system planar of the computer. The socket portions of the cage structure are relatively oriented in a manner such that the expansion cards removably installed therein are arranged in a spaced apart, parallel, facing series with end edges of the cards being aligned with one another.

Extending along these aligned end edge portions of the expansion cards are sheet metal connecting brackets having outwardly bent securement tab portions positioned adjacent the side edge portions of the cards opposite their connector edge portions. These tab portions rest upon an inturned side wall ledge of the cage structure and have notches formed therein that overlie and register with a spaced series of threaded circular openings in the ledge. Each bracket tab is removably secured to the ledge by a screw that extends through the tab notch and is threaded into its associated ledge opening. This individual securement of the bracket tabs to the cage structure ledge serves to anchor the installed expansion cards in place within the cage structure, thereby preventing the connector edge portions of the cards from being dislodged from their associated connector sockets during shipping and handling of the computer.

This conventional use of individual screws to removably secure the card bracket tabs to the cage structure carries with it several well known disadvantages. For example, during initial installation of the expansion cards within the cage structure one or more of the retaining screws can easily fall into the typically crowded interior of the computer, thereby creating a sometimes difficult retrieval problem. Additionally, when a series of expansion cards are installed at the factory each individual bracket retaining screw is typically installed using an automated assembly machine. Several seconds are required to install each screw, thereby appreciably increasing the overall assembly time for each computer in which expansion cards are to be factory installed.

The use of individual card bracket tab retaining screws also creates potential problems and inconveniences for the purchaser of the computer and/or technicians that subsequently work on the expansion card portion of the computer. For example, when subsequently adding or exchanging expansion cards, the technician or computer owner must unscrew the bracket tab in place and then reinsert the removed screw into the bracket tab of the added expansion card. Often, more than one card must be dealt with. This, of course, requires that multiple screws must be removed and then be reinserted. Each time this task is carried out, there is the potential for dropping one or more of the individual retaining screws into the computer system. Additionally, when the computer system is being analyzed for a problem, it is often necessary to remove all of the expansion cards to isolate the problem. This requires the technician or computer owner to remove and reinstall all of the individual retaining screws (a process that may have to be repeated several times during the problem analysis process), thereby further increasing the possibility that one or more screws will be dropped into the innards of the computer system.

From the foregoing it can be readily seen that it would be desirable to provide improved apparatus for removably retaining expansion cards in an associated support cage structure in order to eliminate or at least substantially minimize the above-mentioned problems associated with the conventional use of individual card bracket tab retaining screws. It is accordingly an object of the present invention to provide such improved apparatus.

SUMMARY OF THE INVENTION

In carrying out principles of the present invention, in accordance with a preferred embodiment thereof, an improved support cage structure is provided for operatively and removably receiving a series of spaced apart, parallel computer expansion cards each having, along a side edge thereof, an outwardly projecting connecting bracket tab. The cage structure has a side wall with an inturned ledge portion thereon. When the expansion cards are operatively inserted into the cage structure, the bracket tabs are brought into engagement with the ledge portion.

In contrast to conventional practice, the tabs are not secured to the ledge portion with a series of screws each extending through one of the tabs and threaded into the cage ledge. Instead, all of the tabs are releasably held against the ledge portion by a single locking member. The locking member is secured to the cage structure for movement relative thereto between a first position in which the locking member covers the bracket tabs and prevents them from being separated from the ledge portion in a direction parallel to the aforementioned side edges of the expansion cards, thus preventing removal of the expansion cards from the cage structure, and a second position in which the locking member uncovers the tabs to permit the expansion cards to be removed from the cage structure.

Means are provided for releasably holding the locking member in its first position, such means preferably comprising a threaded opening formed in the cage structure ledge portion and a threaded fastener member captively and rotatably retained on the locking member. When the locking member is moved to its first position, the fastener member is aligned with, and may be screwed into the threaded ledge portion opening. Since a single fastening member is used in conjunction with the locking member to lock all of the bracket tabs to the ledge portion, and the single fastening member is captively retained on the locking member, the possibility of dropping card retention screws into the computer system is eliminated. Additionally, both the initial installation and subsequent removal of the expansion cards may be more easily and rapidly carried out.

In a preferred embodiment thereof, the locking member is secured at one end thereof for pivotal movement between its first and second positions, and the single threaded fastening member is carried on the outer end of the locking member. The locking member is representatively formed from an elongated rectangular strip of sheet metal having a transversely bent side edge portion serving as a stiffening rib that increases the rigidity of the locking member. With the locking member pivoted to its first position, the outer end of the locking member is received in an indentation formed in an offset end section of the ledge portion and surrounding the threaded ledge portion opening.

According to another feature of the invention, the bracket tabs have notches therein, and the ledge portion has formed thereon a spaced series of projections. When the expansion cards are operatively inserted into the cage structure these projections are received in the tab notches and serve as abutments that block appreciable movement of the tabs relative to the ledge portion in directions perpendicular to the aforementioned card side edges and parallel to the planes of the installed expansion cards.

DETAILED DESCRIPTION

Figure 1:
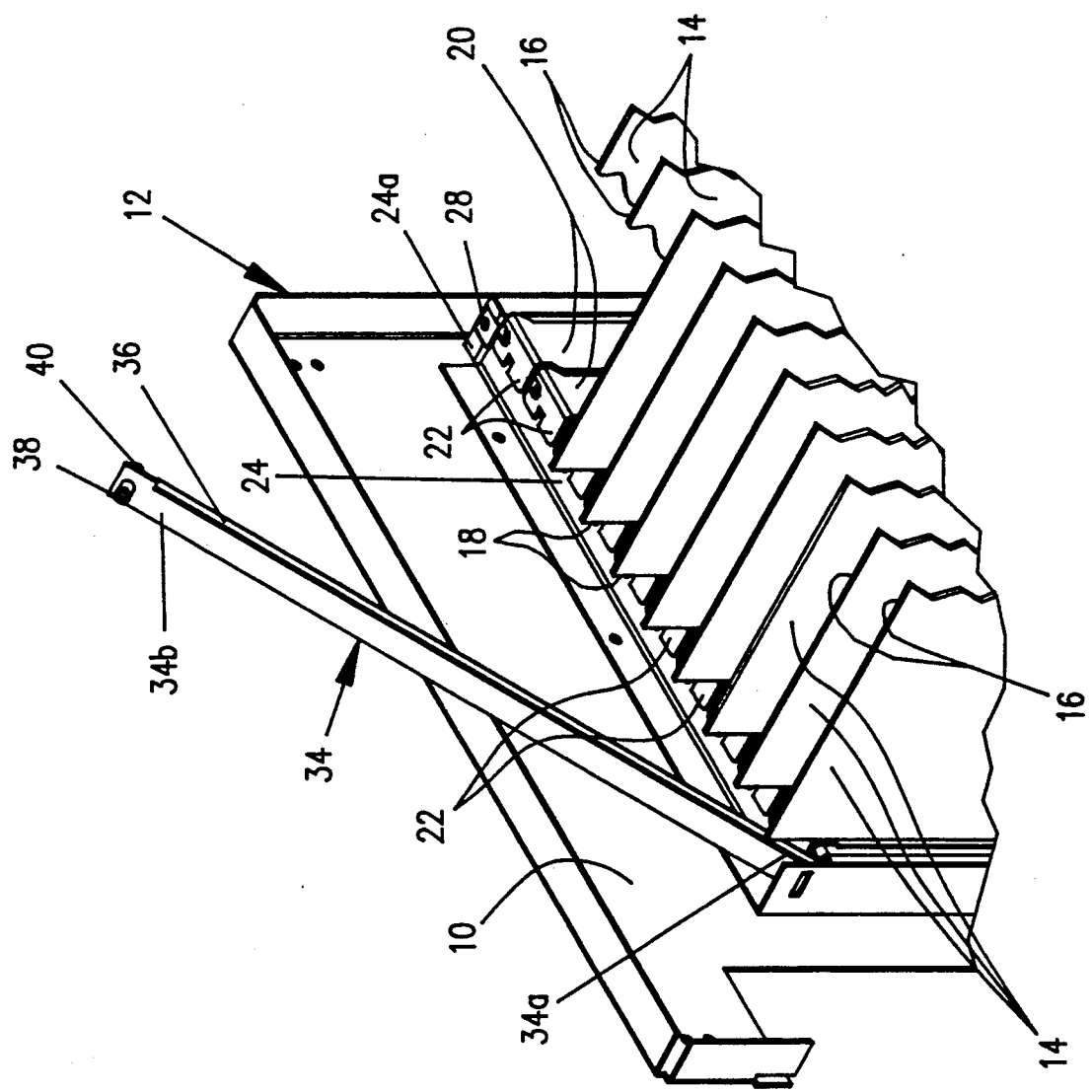
FIG. 1 is a partially cut away perspective view of portions of a spaced series of computer expansion cards mounted in an improved support structure embodying principles of the present invention with a latch bar portion of the support structure being shown in its opened position.
Figure 2:
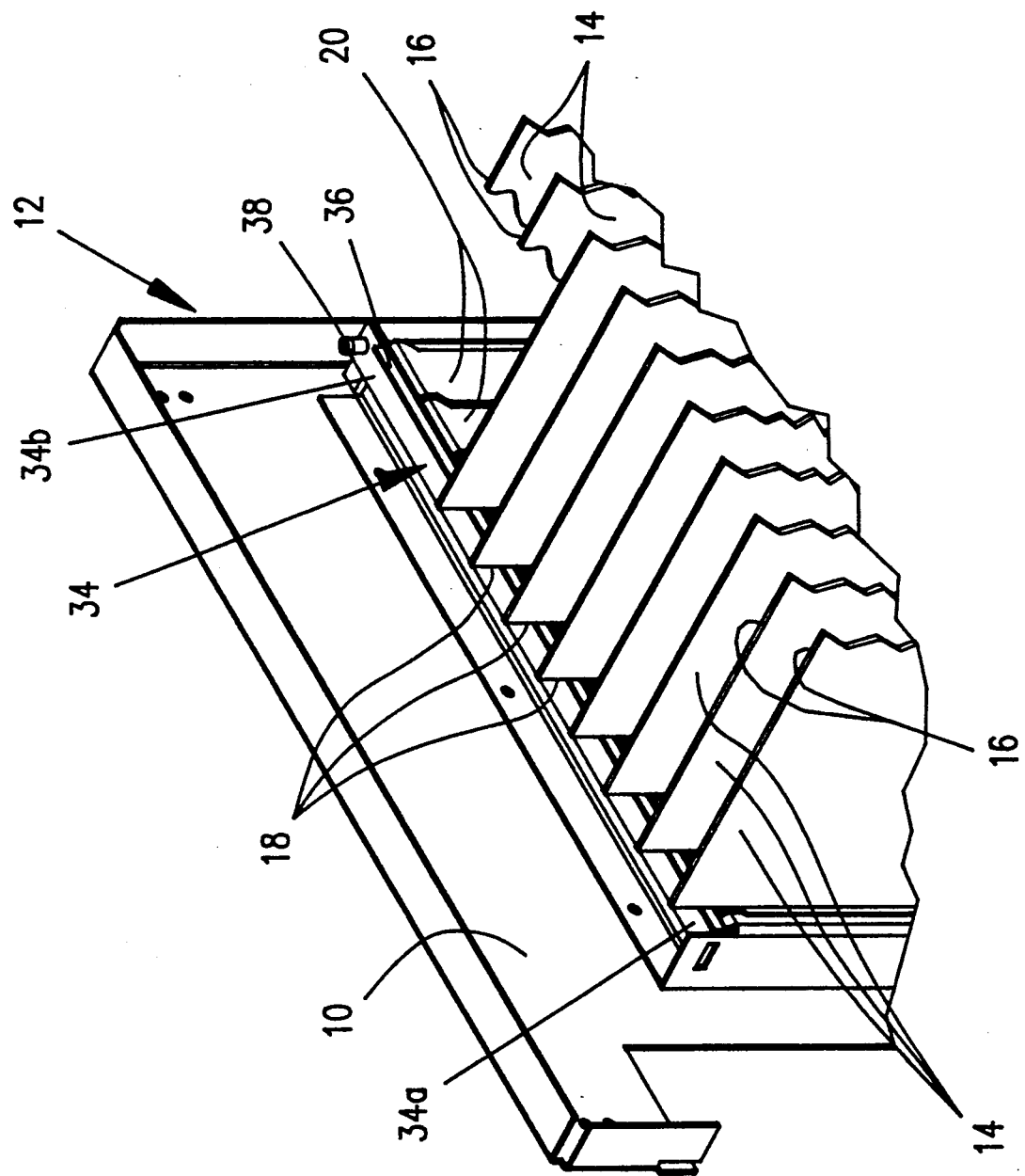
FIG. 2 is a perspective view similar to that in FIG. 1, but with the latch bar portion of the support structure being shown in its closed position.

Perspectively illustrated in FIGS. 1 and 2 is a side wall portion 10 of a sheet metal support cage structure 12, often referred to simply as a "card cage", disposed within the housing of a personal computer (not shown) and used to operatively and removably support a spaced series of expansion cards 14 in their indicated parallel, facing relationship. The expansion cards are of a conventional construction and have upper side edges 16 and left end edges 18 that face the cage side wall 10.

Edge connector portions (not shown) are formed along the bottom side edges of the expansion cards and removably plug into corresponding socket portions (also not shown) on the bottom of the cage structure to operably couple the expansion cards to the computer motherboard or system planar. Depending on the size of the expansion cards, their right end edges (not shown) are either free standing or are received in vertical guide slots formed in a cage side wall (not shown) that opposes the illustrated cage side wall 10.

Secured to and extending upwardly along the left end edges 18 of the expansion cards 14 are elongated rectangular sheet metal connecting brackets 20, also of a conventional construction, that have outwardly bent retaining tab portions 22 positioned at their upper ends and downwardly offset from the upper side edges of the expansion cards. With the expansion cards 14 operatively received in the cage structure 12 each of the tabs 22 overlies and engages an inturned rectangular side wall ledge portion 24 of the cage structure.

Figure 3:
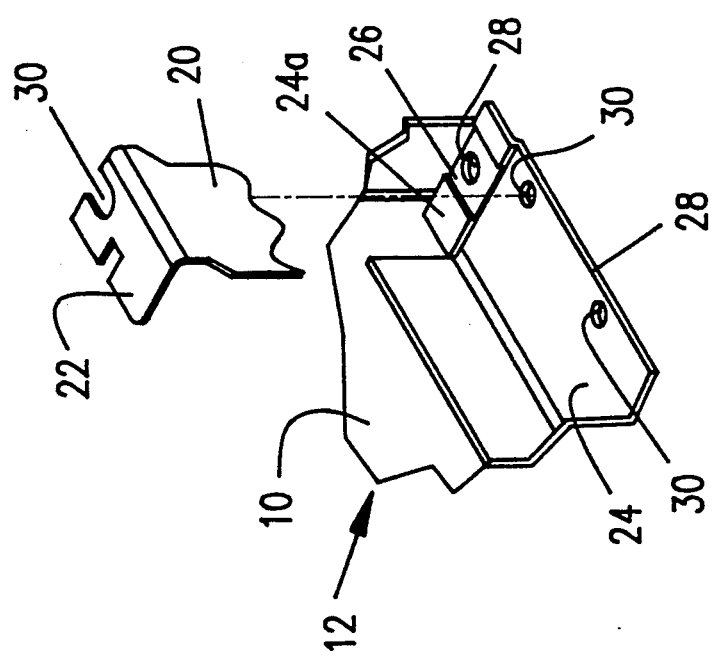
FIG. 3 is an enlarged scale exploded fragmentary perspective detail view of portions of a ledge section of the support structure and a mounting bracket portion of one of the expansion cards.

As best illustrated in FIG. 3, a right end portion 24a of the ledge 24 is slightly raised relative to the balance of the ledge and has a rectangular indentation 26 therein. For purposes later described, the indented area 26 has a threaded circular opening 28 formed therein. Extending longitudinally along the top side of the ledge 24, adjacent its inner side edge 28, are a spaced series of upwardly projecting cylindrical guide bosses 30. When the expansion cards 14 are downwardly inserted into their connector sockets, the bosses 30 enter arcuate side edge notches 30 formed in the tabs 22. These bosses serve to stabilize the installed expansion cards 14 against movement toward and away from the cage side wall 10.

In the present invention, the bosses 30 replace the individual threaded openings that would conventionally underlie the tab notches 30 and threadingly receive individual retaining screws functioning to hold the tabs 22 against the top side of the ledge 24 to thereby prevent undesirable upward movement of the installed expansion cards 14 relative to the cage structure 12—a movement which would tend to unplug the cards from their cage sockets.

The present invention uniquely replaces these individual retaining screws, which can undesirably drop into the adjacent computer system during installation or removal of the expansion cards, with a single tab retaining member in the form of a sheet metal locking bar 34 shown in FIGS. 1 and 2. The locking bar 34 has an elongated rectangular configuration and is pivotally secured at its left or inner end 34a to the cage structure above the ledge 24. An outer side edge portion 36 of the locking bar 34 is upwardly bent and serves as a stiffening rib to increase the rigidity of the bar. Captively retained on the right or outer end 34b of the locking bar 34, and rotatable relative thereto, is a lock screw 38 having a threaded lower end portion 40 (see FIG. 1) extending downwardly beyond the locking bar end portion 34b.

As may be seen by comparing FIGS. 1 and 2, the locking bar is pivotable relative to the cage structure 12 between a closed position (FIG. 2) in which the bar overlies and engages the top sides of the bracket tabs 22, thereby blocking upward movement of the tabs (and thus the expansion cards) relative to the cage structure, and an opened position in which the locking bar is swung upwardly away from the tabs 22 to permit upward removal of any or all of the expansion cards from the cage structure.

With the locking bar 34 in its opened FIG. 1 position, the expansion cards 14 may be operatively inserted downwardly into the cage structure 12 in a manner causing the bosses 30 (see FIG. 3) to upwardly enter the tab notches 30 and the tabs 22 to downwardly engage the top side of the cage structure side wall ledge 24. To simultaneously lock all of the tabs 22 in place against the ledge 24, thereby locking the installed expansion cards in place within the cage structure 12, the bar 34 is simply pivoted downwardly to its FIG. 2 closed position. With the bar 34 in its closed position, its right end portion 34b enters the right ledge end indentation 26 (see FIG. 3), the bottom side of the bar 34 is brought into engagement with the top sides of the tabs 22, and the threaded portion 40 of the lock screw 38 is brought downwardly into registry with the threaded ledge end opening 28.

To simultaneously lock all of the tabs 22 into place on the top side of the ledge 24 the single screw 38 is simply rotated to tighten its threaded portion 40 into the ledge opening 28. To subsequently remove any or all of the expansion cards 14 from the cage structure 12 the single, captively retained screw 38 is simply rotated to disengage it from the ledge 24 and the locking bar is pivoted upwardly from its FIG. 2 closed position to its FIG. 1 opened position to thereby simultaneously free all of the expansion cards 14 for upward removal from the cage structure 12.

It can readily be seen that the unique use of the locking bar 34 permits the simultaneous locking and unlocking of all of the expansion cards on the cage structure without the conventional use of a series of fastening screws to individually secure the card tabs 22 to the cage structure ledge 24. Because the bar fastening means, representatively in the form of the cooperating screw 38 and threaded ledge opening 28, are a permanent part of the overall cage structure 12, there are no separable fastening members which can fall into the computer system during installation and/or removal of the expansion cards. Additionally, both the installation and removal time for the expansion cards are desirably lessened, and such installation and removal are considerably easier and require substantially less manual dexterity.

While the cooperating threaded ledge opening 28 and single captively retained screw 38 are quite easy to use, other captively retained means on the bar 34 and ledge 24 could be used to releasably hold the bar in its closed position on the ledge 24. For example, cooperatively engageable snap fastener structures could be captively retained on the bar 34 and the ledge 24. Alternatively, the screw 38 could be replaced with an opening in the bar end portion 34a that is brought into registry with the ledge opening 28 when the bar is pivoted to its closed position. A security locking device (such as a small key lock) could then be passed through the aligned openings to prevent unauthorized opening of the locking bar 34. Moreover, movable locking members having configurations other than that of the representatively illustrated pivotal locking bar 34 could be utilized if desired.

The foregoing detailed description is to be clearly understood as being given by way of illustration and example only, the spirit and scope of the present invention being limited solely by the appended claims.

What is claimed is:

1. A computer expansion card cage structure into which a spaced series of parallel expansion cards operatively inserted in an insertion direction, each of the expansion cards having a connection bracket extending along a side edge thereof and having an outwardly projecting end tab, said computer expansion card cage structure comprising:
   a ledge portion with a side surface positioned to be engaged by the connection bracket end tabs of the inserted expansion cards;
   a locking member supported for movement relative to said ledge portion between a closed position in which said locking member overlies a plurality of the end tabs and blocks movement of the end tabs, and thus the inserted expansion cards, relative to said ledge portion in a direction opposite to said insertion direction, and an opened position unblocking the end tabs and freeing the inserted expansion cards for removal from said expansion card cage structure; and
   means for releasably holding said locking member in said closed position thereof.

2. The computer expansion card cage structure of claim 1 wherein said means for releasably holding said locking member in said closed position thereof include cooperatively engageable locking structures permanently carried on said locking member and said ledge portion.

3. The computer expansion card cage structure of claim 2 wherein said cooperatively engageable locking structures include:
   a threaded opening formed in said ledge portion, and
   a threaded fastening member captively retained on said locking member for movement therewith and rotation relative thereto, said threaded fastening member being aligned with, and threadable into, said threaded opening when said locking member is brought to said closed position thereof.

4. The computer expansion card cage structure of claim 1 further comprising:
   means carried on said ledge portion side surface for inhibiting movement of the connection bracket end tabs of the inserted expansion cards in directions generally perpendicular to said insertion direction and parallel to the planes of the inserted expansion cards.

5. The computer expansion card cage structure of claim 4 wherein:
   the connection bracket end tabs have notches formed therein, and
   said means carried on said ledge portion side surface include a spaced series of boss members formed thereon and positioned to be received in the end tab notches when the expansion cards are operatively inserted into said expansion card cage structure.

6. The computer expansion card cage structure of claim 1 wherein:
   said locking member has an elongated, generally flat bar-shaped configuration and is supported at a first end thereof for pivotal movement between said opened and closed positions.

7. The computer expansion card cage structure of claim 6 wherein said means for releasably holding said locking member include:
   a threaded opening formed in said ledge portion, and
   a single screw member captively retained on the second end of said locking member for pivotal movement therewith and rotation relative thereto, said single screw member being aligned with, and threadable into, said threaded opening when said locking member is pivoted to said closed position thereof.

8. The computer expansion card cage structure of claim 7 wherein:
   said ledge portion has an offset section with an indentation formed therein around said threaded opening and positioned to receive said second end of said locking member when said locking member is pivoted to said closed position thereof.

9. The computer expansion card cage structure of claim 6 wherein:
   said locking member is formed from a sheet metal material and has means thereon for stiffening said locking member.

10. The computer expansion card cage structure of claim 9 wherein said stiffening means include a transversely bent side edge portion of said locking member extending between its opposite ends.

11. Computer apparatus comprising:
   an expansion card cage structure having a side wall with an inturned ledge portion thereon;
   a spaced plurality of parallel expansion cards removably received in said expansion card cage structure, said expansion cards having secured to side edges thereof outwardly projecting tabs releasably engaging said ledge portion;
   a locking member carried by said expansion card cage structure for movement relative thereto between a first position in which said locking member covers said tabs in a manner holding them against said ledge portion to prevent removal of said expansion cards from said expansion card cage structure, and a second position in which said locking member uncovers said tabs to permit removal of said expansion cards from said expansion card cage structure; and
   a fastening structure operative to releasably hold said locking member in said first position thereof.

12. The computer apparatus of claim 11 wherein said fastening structure includes:
   a threaded opening formed in one of said locking member and said ledge portion, and
   a threaded fastener member captively and rotatably retained on the other of said locking member and said ledge portion and being positioned to be threaded into said threaded opening when said locking member is moved to said first position thereof.

13. The computer apparatus of claim 12 wherein:
   said threaded fastener member is carried on said locking member for movement therewith.

14. The computer apparatus of claim 13 wherein:
   said locking member is pivotally movable between said first and second positions thereof.

15. The computer apparatus of claim 11 further comprising:
   notches formed in said tabs, and
   a spaced series of projections formed on said ledge portion, received in said notches, and acting as abutments to inhibit movement of said tabs in directions perpendicular to said side edges of said expansion cards and parallel to the planes of said expansion cards.

* * * * *